United States Patent
Choi et al.

(10) Patent No.: US 8,178,867 B2
(45) Date of Patent: May 15, 2012

(54) ORGANIC LIGHT EMITTING DISPLAY AND FABRICATING METHOD THEREOF

(75) Inventors: Jun-Ho Choi, Yongin-si (KR);
Seong-Min Kim, Anyang-si (KR);
Jin-Koo Chung, Suwon-si (KR);
Jae-Kook Ha, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 352 days.

(21) Appl. No.: 12/560,625

(22) Filed: Sep. 16, 2009

(65) Prior Publication Data
US 2010/0102333 A1    Apr. 29, 2010

(30) Foreign Application Priority Data
Oct. 28, 2008    (KR) .................... 10-2008-0105983

(51) Int. Cl.
*H01L 35/24* (2006.01)

(52) U.S. Cl. .................... 257/40; 257/79; 257/E51.001

(58) Field of Classification Search .................... 257/40, 257/79, E51.001
See application file for complete search history.

(56) References Cited

U.S. PATENT DOCUMENTS

| 2009/0085478 A1* | 4/2009 | Cok et al. .................... 313/506 |
| 2010/0194268 A1* | 8/2010 | Choi et al. .................... 313/504 |

* cited by examiner

*Primary Examiner* — Anthony Ho
(74) *Attorney, Agent, or Firm* — F. Chau & Associates, LLC (57) ABSTRACT

An organic light emitting display includes an insulating substrate having a first area, a second area, and a third area, an organic layer located in the second area, a pixel electrode located on the organic layer in the first area and the second area, and a partition wall including an opening exposing a portion of the pixel electrode. The organic light emitting display further includes an organic light emitting member located in the opening and a common electrode located on the organic light emitting member. The opening is disposed in the first area, and the third area includes a trench separating the second area from an adjacent second area.

20 Claims, 14 Drawing Sheets

ORGANIC LIGHT EMITTING DISPLAY AND FABRICATING METHOD THEREOF

This application claims priority to Korean Patent Application No. 10-2008-0105983, filed on Oct. 28, 2008, the disclosure of which is hereby incorporated by reference herein in its entirety for all purposes.

BACKGROUND OF THE INVENTION (a) Technical Field

The present disclosure relates to an organic light emitting display and to a fabricating method thereof.

(b) Description of the Related Art

An organic light emitting display ("OLED") may include an anode, a cathode, and an organic light emitting member therebetween. The anode may inject holes into the light emitting member and the cathode may inject electrons into the light emitting member. The injected electrons and holes may then be combined to form excitons, and the exictones may emit light as they discharge energy. Because the OLED is a self-emissive display device, an additional light source may not be necessary. Therefore, the OLED may have low power consumption, as well as a high response speed, a wide viewing angle, and a high contrast ratio.

Generally, an OLED includes thin film transistors and metal wiring on a substrate. A flat organic layer is formed on the thin film transistors and the metal wirings to reduce protrusions and depressions which may be caused by them. An organic light emitting member is formed on the flat organic layer. However, as the organic layer is made of an organic material and moisture or impurities may thus exist therein. Moreover, the impurities or the moisture may penetrate into the organic light emitting member and cause emission area shrinkage. As a result, the penetrated impurities or moisture may degrade the organic light emitting member from the corners, thereby reducing the size of the emission area.

Thus, there is a need in the art for an organic light emitting display in which impurities or moisture existing in an organic layer can be prevented from penetrating into the emitting member.

BRIEF SUMMARY OF THE INVENTION

Embodiments of the present invention may provide an organic light emitting display in which impurities or moisture existing in an organic layer or color filters can be prevented from penetrating into the emitting member and causing emission area shrinkage.

In accordance with an exemplary embodiment of the present invention, an organic light emitting display is provided. The organic light emitting display includes an insulating substrate having a first area, a second area, and a third area, an organic layer located in the second area, a pixel electrode located on the organic layer in the first area and the second area, and a partition wall including an opening exposing a portion of the pixel electrode. The organic light emitting display further includes an organic light emitting member located in the opening and a common electrode located on the organic light emitting member, The opening is disposed in the first area, and the third area includes a trench separating the second area from an adjacent second area.

The trench can be formed by removing a portion of the organic layer.

The pixel electrode is formed along the upper side of the trench.

The trench can be filled with the partition wall and include polyimide.

The organic light emitting display further includes a thin film structure, and a contact hole. The thin film transistor includes a transistor located between the insulating substrate and the organic layer. The pixel electrode is formed along the side and the bottom of the contact hole. The contact hole is disposed in the second area.

The organic light emitting display can include a blocking layer formed on the organic layer and along the side and the bottom of the trench. The blocking layer can include silicon nitride.

The first area is disposed in the second area and the third area surrounds the second area.

In accordance with an exemplary embodiment of the present invention, an organic light emitting display is provided. The organic light emitting display includes a transistor located on an insulating substrate, an organic layer located on the transistor, a trench located in the organic layer, a contact hole exposing a portion of the transistor, a pixel electrode electrically connected to the transistor through the contact hole, and a partition wall located on the pixel electrode and including an opening. The organic light emitting display further includes an organic light emitting member located on the pixel electrode, and a common electrode located on the organic light emitting member.

The trench exposes a portion of the insulating substrate.

The pixel electrode covers a portion of the upper side of the trench.

The partition wall can extend into the trench.

The organic light emitting display can include a blocking layer located between the pixel electrode and the organic layer and along the bottom of the trench. The blocking layer includes silicon nitride. The first area is disposed in the second area and the third area surrounds the second area.

In accordance with another exemplary embodiment of the present invention, a method of manufacturing an organic light emitting display is provided. The method includes forming a transistor on an insulating substrate, forming an organic layer on the transistor, removing a portion of the organic layer to form a contact hole and a trench, removing impurities or moisture in the organic layer, forming a pixel electrode on the contact hole and the trench, forming an insulating layer on the pixel electrode and in the trench, patterning the insulating layer to form an opening exposing a portion of the pixel electrode, forming an organic light emitting member in the opening, and forming a common electrode on the organic light emitting member.

BRIEF DESCRIPTION OF THE DRAWINGS

Exemplary embodiments of the present invention can be understood in more detail from the following description taken in conjunction with the accompanying drawings in which.

Use of the same reference symbols in different figures indicates similar or identical items.

DETAILED DESCRIPTION OF THE EXEMPLARY EMBODIMENTS OF THE INVENTION

Figure 1:
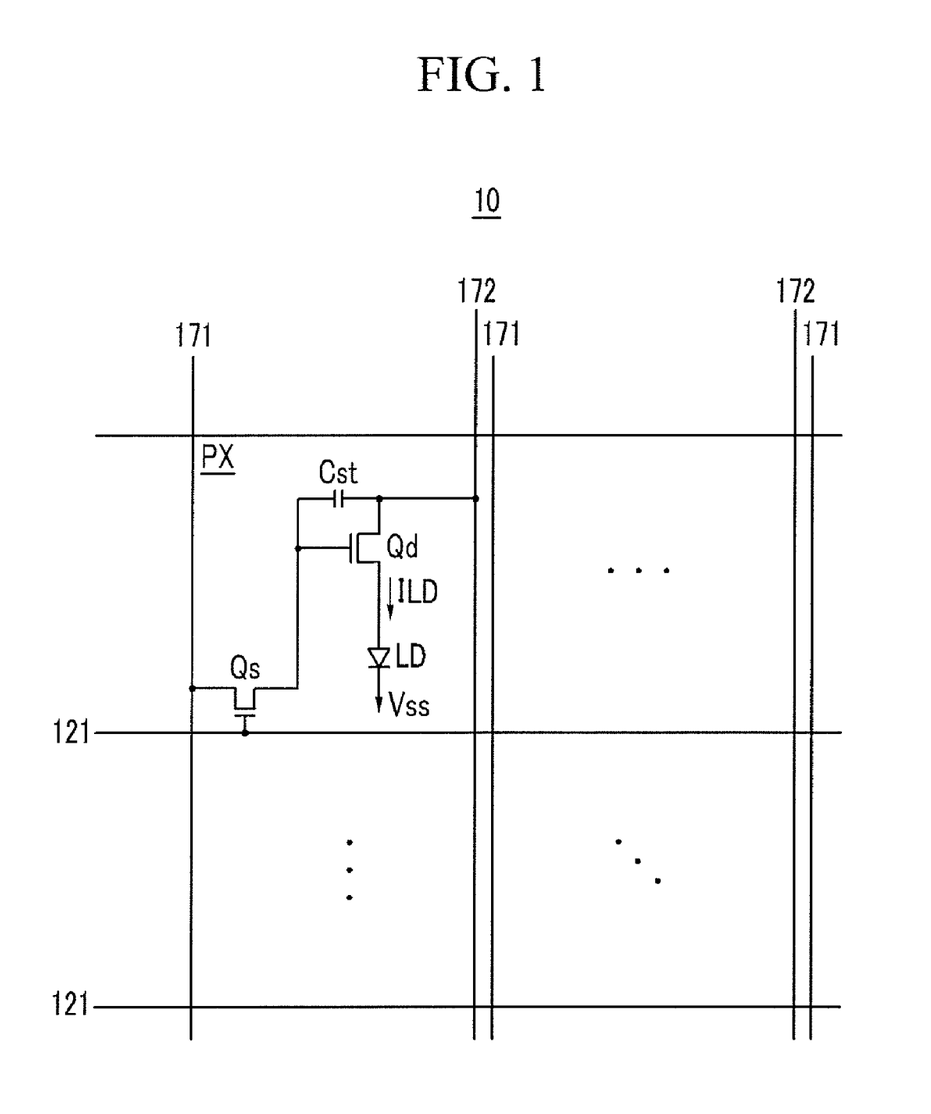
FIG. 1 is an equivalent circuit of an exemplary organic light emitting display according to an exemplary embodiment of the present invention.

FIG. 1 is an equivalent circuit of an exemplary organic light emitting display according to an exemplary embodiment of the present invention. Referring to FIG. 1, an OLED 10 according to an exemplary embodiment of the present invention includes a plurality of signal lines 121, 171, and 172, and a plurality of pixels PX arranged in a matrix. The pixels are defined by the signal lines 121, 171, and 172.

The signal lines include gate lines 121, data lines 171, and driving voltage lines 172. Each gate line 121 transmits a gate signal (e.g., scan signal). Each data line 171 transmits a data signal, and each driving voltage line 172 transmits a driving voltage. The gate lines 121 extend in a row direction and are parallel to each other. The data lines 171 and the driving voltage lines 172 extend in a column direction and are parallel to each other.

Each pixel PX has a switching transistor Qs, a driving transistor Qd, a storage capacitor Cst, and an organic light emitting element LD.

The switching transistor Qs includes a control terminal, an input terminal and an output terminal. The control terminal is connected to the gate line 121 and the input terminal is connected to the data line 171. The output terminal is connected to the driving transistor Qd. The switching transistor Qs transmits the data signal received from the data line 171 to the driving transistor Qd in response to the gate signal received from the gate line 121.

The driving transistor Qd includes a control terminal, an input terminal and an output terminal. The control terminal is connected to the switching transistor Qs, and the input terminal is connected to the driving voltage line 172. The output terminal is connected to the organic light emitting element LD. The output current $I_{LD}$ of the driving transistor Qd is a function of a voltage difference between the control terminal and the output terminal.

The storage capacitor Cst is connected between the control terminal and the input terminal. The storage capacitor Cst stores the data signal applied to the control terminal of the driving transistor Qd and maintains it after the switching transistor Qs turns off.

The organic light emitting element LD includes a pixel electrode connected to the output of the driving transistor Qd and a common electrode connected to a common voltage Vss. The organic light emitting element LD displays an image depending on the output current $I_{LD}$ of the driving transistor Qd.

The switching transistor Qs and the driving transistor Qd can include an n type transistor. However, at least one of the switching transistor Qs or the driving transistor Qd may be a p type transistor. Also, the connection between the transistors Qs and Qd, the storage capacitor Cst and the organic light emitting element LD can be changed. Other transistors may be further included in the pixel PX to compensate for a threshold voltage of the driving transistor or the organic light emitting element LD.

Figure 2:
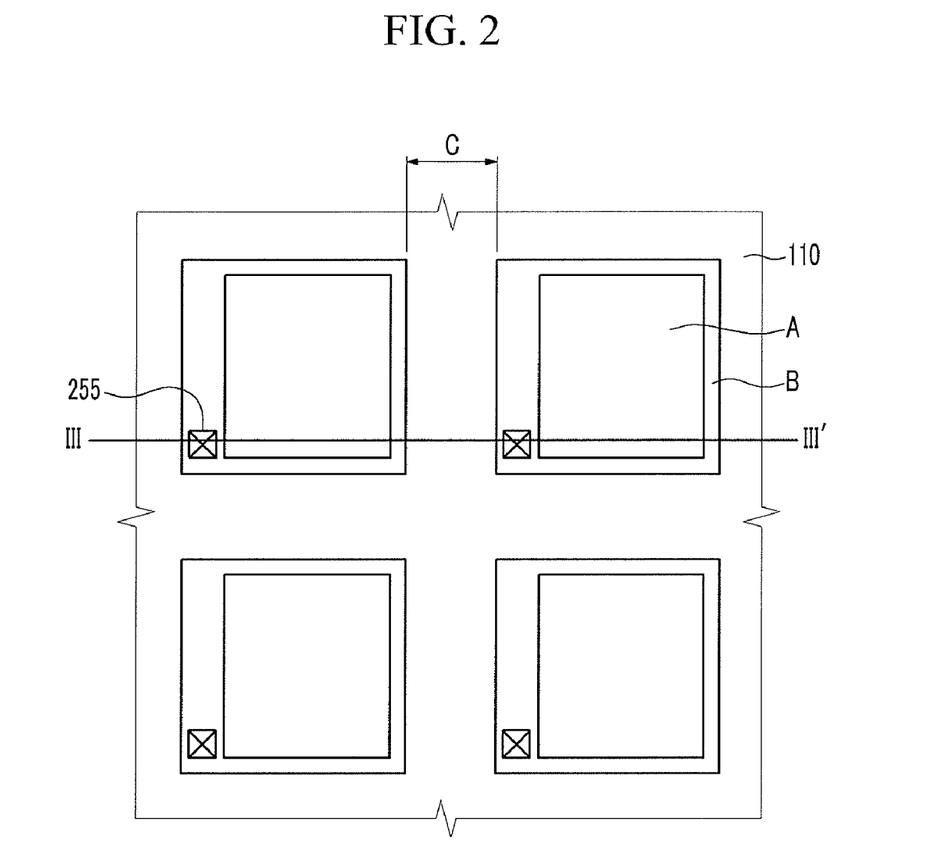
FIG. 2 is a layout view of an exemplary organic light emitting display according to an exemplary embodiment of the present invention.

FIG. 2 is a layout view of the organic light emitting display of FIG. 1 according to an exemplary embodiment of the present invention.

Each pixel PX of the organic light emitting display according to the exemplary embodiment includes an emission area A, an organic layer area B, a separation area C, and a contact hole 255. The emission area A is an area where light emits, and the organic layer area B is an area where a flat organic layer is formed. The organic layer area B surrounds the emission area A. The separation area C is disposed between the adjacent organic layer areas B. The contact hole 255 is formed in the organic layer area B.

Figure 3:
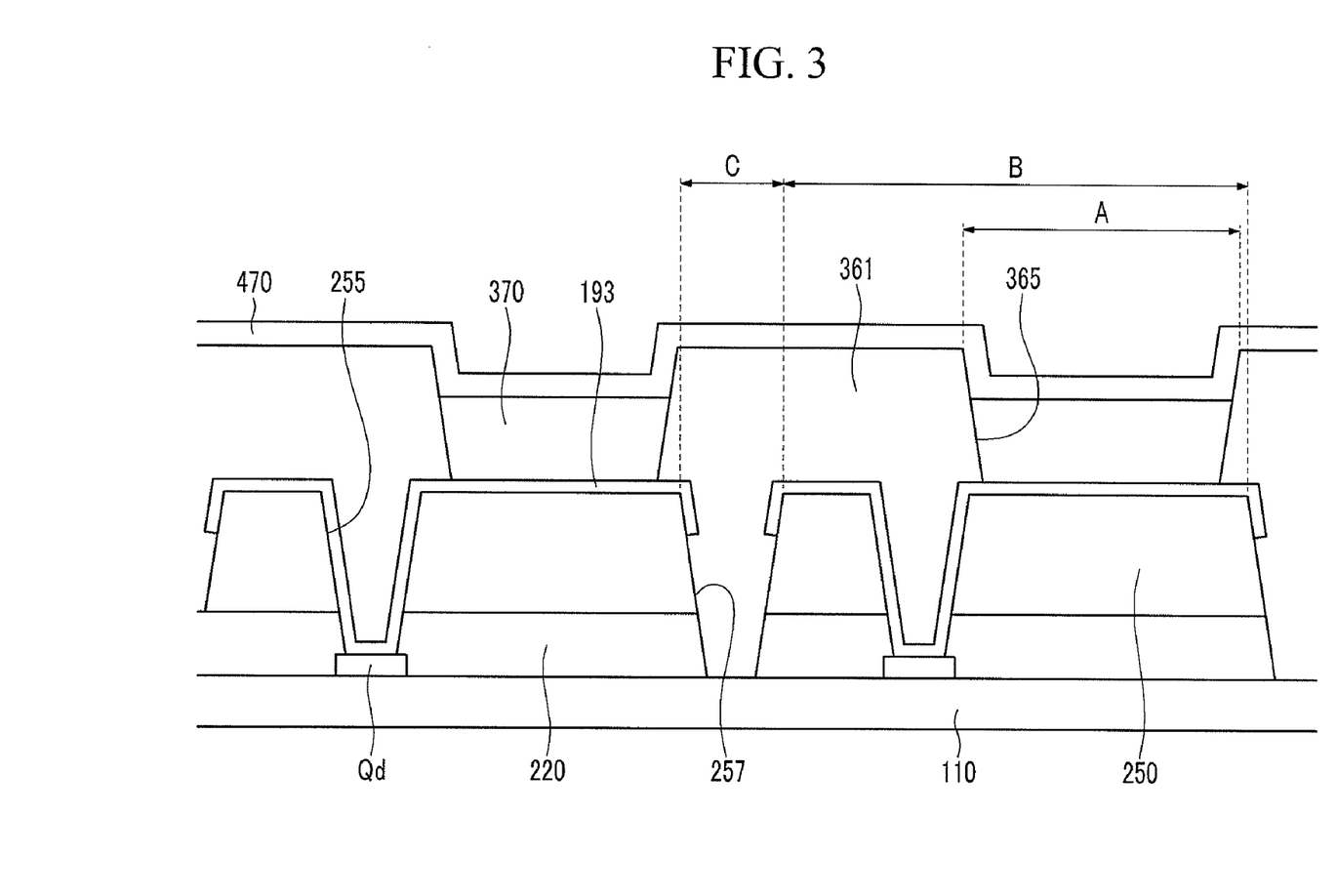
FIG. 3 is a sectional view of the exemplary embodiment of the present invention, taken along the line III-III' of FIG. 2.

FIG. 3 is a sectional view of the exemplary organic light emitting display, taken along the line III-III" of FIG. 2.

Referring to FIG. 3, a plurality of driving transistors Qd are formed on an insulating substrate 110. The insulating substrate 110 can include, for example, glass, quartz, ceramic, or plastic.

A thin film structure 220 including a switching transistor such as the switching transistor Qs of FIG. 1 can be formed on the insulating substrate 110. The thin film structure 220 can include an insulating layer covering or a thin film layer under the driving transistors Qd.

An organic layer 250 is formed on the thin film structure 220 in an organic layer area B. The organic layer 250 can, for example, include polyacrylate, and have a flat surface. The organic layer 250 and the thin film structure 220 include a plurality of contact holes 255 to expose a portion of the driving transistors Qd and trenches 257. The trench 257 is disposed in a separation area C to expose a portion of the insulating substrate 110. A plurality of pixel electrodes 193 are formed on the organic layer 250 to cover upper sides of the trenches 257. Each pixel electrode 193 is connected to the associated driving transistor Qd through the contact hole 255. The pixel electrode 193 includes a transparent conductive layer such as, for example, indium tin oxide (ITO) or indium zinc oxide (IZO)

A partition wall 361 is formed on the pixel electrode 193. The partition wall 361 has a plurality of openings 365. The partition wall 361 can include, for example, polyimide. The opening 365 is disposed in the emission area A. The trench 257 can be filled with the partition wall 361. An organic light emitting member 370 is formed on the pixel electrode. The organic light emitting member 370 can represent a primary color such as, for example, red, green, or blue. In the event the organic light emitting member 370 represents white color, the organic light emitting member 370 can be formed on the partition wall 361, and color filters can be further formed in the direction where light is emitted.

A common electrode 470 is formed on the organic light emitting member 370 and transmits a common voltage Vss.

The common electrode 470 can include, for example, calcium (Ca), barium (Ba), magnesium (Mg), aluminum (Al), silver (Ag), or alloy thereof.

The pixel electrode 193, the organic light emitting member 370 and the common electrode 470 form the organic light emitting element LD of FIG. 1. The pixel electrode can be an anode, and the common electrode can be a cathode.

The organic light emitting display can display images by radiating light through the insulating substrate or the opposition thereof.

According to an exemplary organic light emitting display, a portion of the organic layer 250 is removed to form the separation area C, thereby increasing the surface area exposed to the organic layer 250. After forming the organic layer 250, the organic layer 250 is annealed, thereby increasing the removal of impurities or moisture through the increased surface area and reducing the emission area.

A protective layer, a moisture absorption film, or other similar layers may be formed on the top of the common electrode 180. An encapsulation member such as, for example, glass can be further included.

In another embodiment, light can be emitted through the common electrode. In this event, the pixel electrode can include a reflective film and the common electrode can include a semi-transparent conductive layer.

FIGS. 4 to 7 illustrate a method of manufacturing an organic light emitting display of FIGS. 2 and 3 according to an exemplary embodiment of the present invention.

Figure 4:
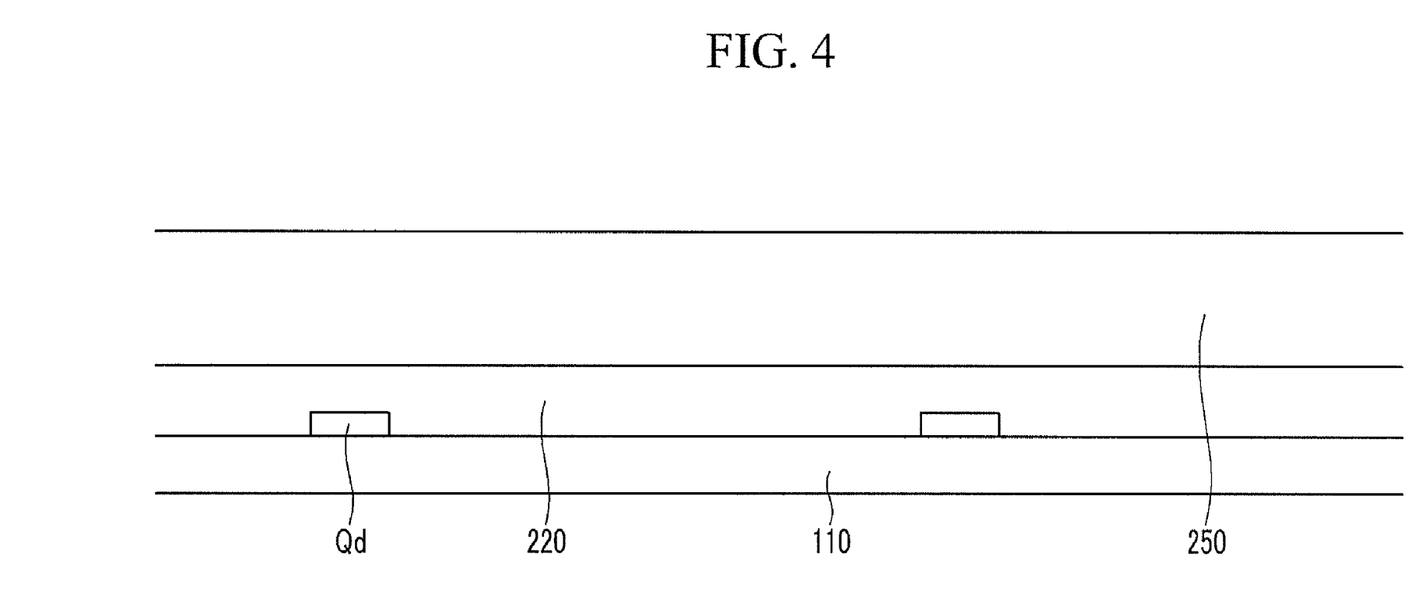
FIGS. 4 to 7 illustrate a method of manufacturing an organic light emitting display according to an exemplary embodiment of the present invention.

Referring to FIG. 4, a plurality of driving transistors Qd, a thin film structure 220 and an organic layer 250 are formed on an insulating substrate 110. The organic layer 250 can include, for example, photo sensitive material.

Figure 5:
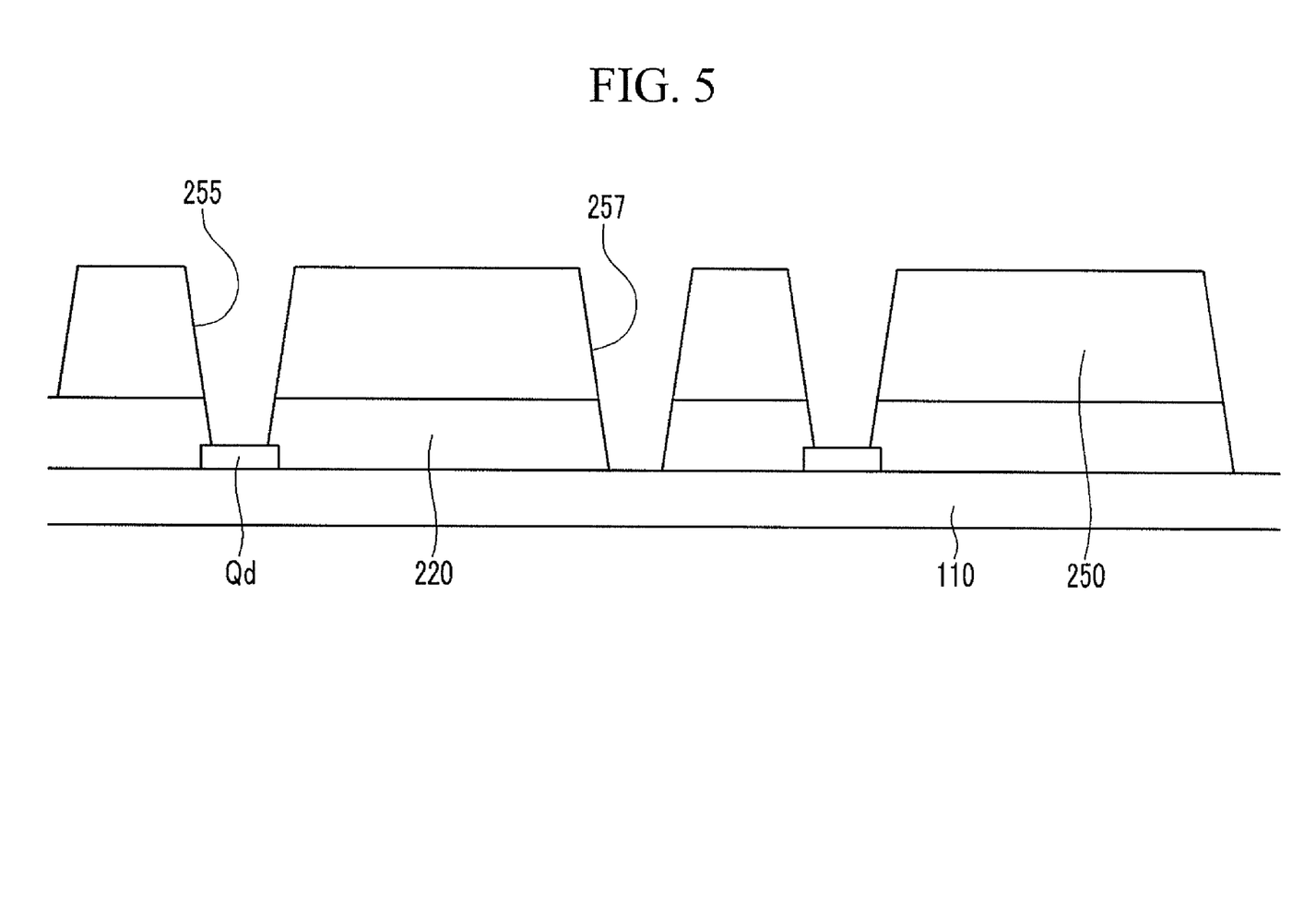

Referring to FIG. 5, a plurality of contact holes 255, trenches 257 are formed in the organic layer 250 and the thin film structure 220 by, for example, a photolithography process. Next, the organic layer 250 is annealed at, for example, a range of about 200° C. to about 250° C. during, for example, about 30 min. to about one hour to remove impurities or moisture in the organic layer 250.

In another embodiment, light such as, for example, ultraviolet (UV) light can be radiated to the organic layer 250 to remove impurities or moisture.

Figure 6:
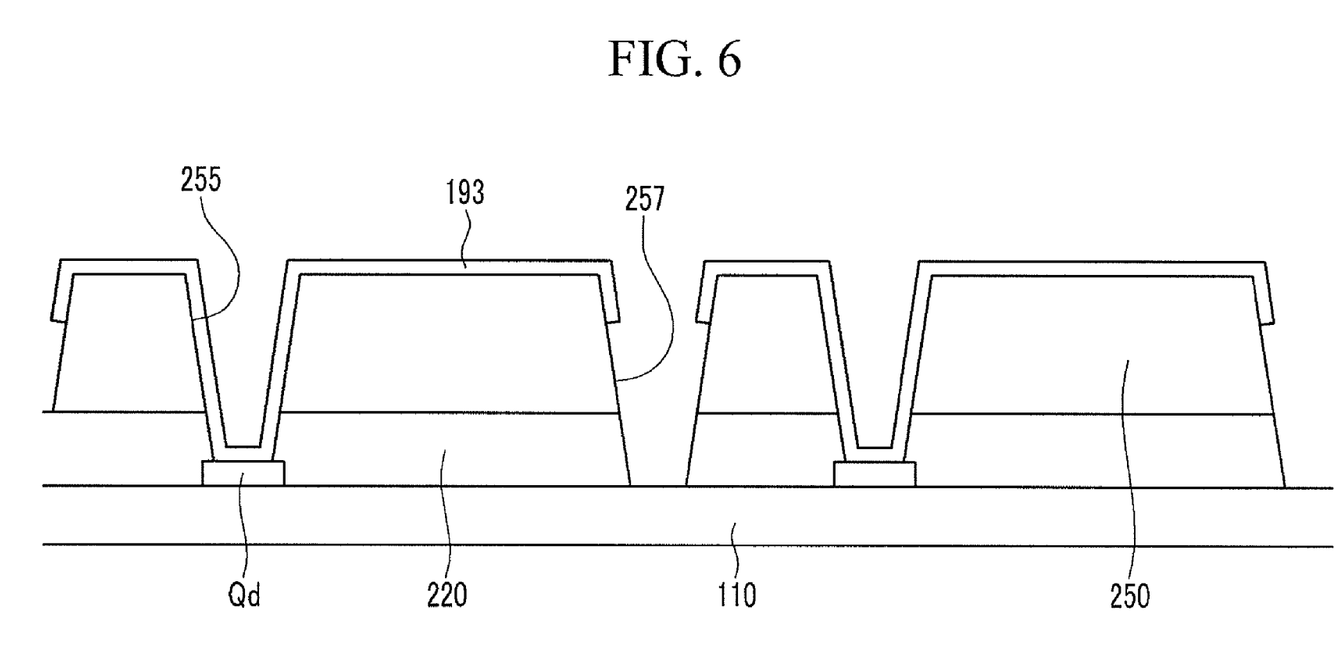

Referring to FIG. 6, a transparent conductive layer such as, for example, indium tin oxide or indium zinc oxide is formed on the organic layer 250 and patterned to form pixel electrodes 193. The pixel electrode 193 is connected to the driving transistor Qd through the contact hole 255.

Figure 7:
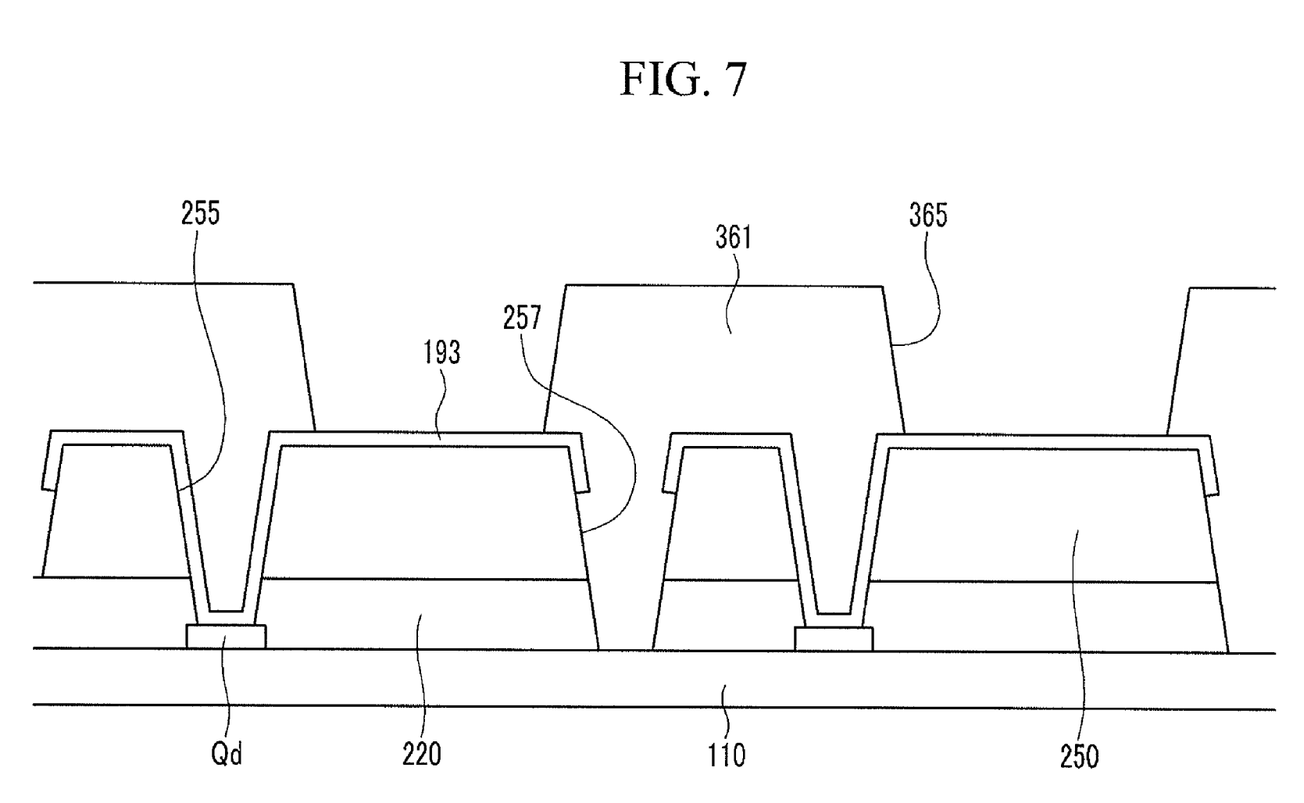

Referring to FIG. 7, an insulating material such as a photosensitive organic material is deposited and patterned to form a partition wall 361 having openings 365. The openings 365 expose a portion of the pixel electrodes 193. The partition wall 361 can include, for example, non-photosensitive materials. The trenches 257 and the contact holes 255 are filled with the partition wall 361.

Referring to FIG. 3, an organic light emitting member 370 is formed in the opening 365, and a common electrode 470 is formed on the partition wall 361 and the light emitting member 370.

According to this embodiment, the pixel electrode 193 covers an upper side of the trench 257, thereby reducing the amount of impurities or moisture which may penetrate into organic light emitting member 370 through the corner of the organic layer 250.

Figure 8:
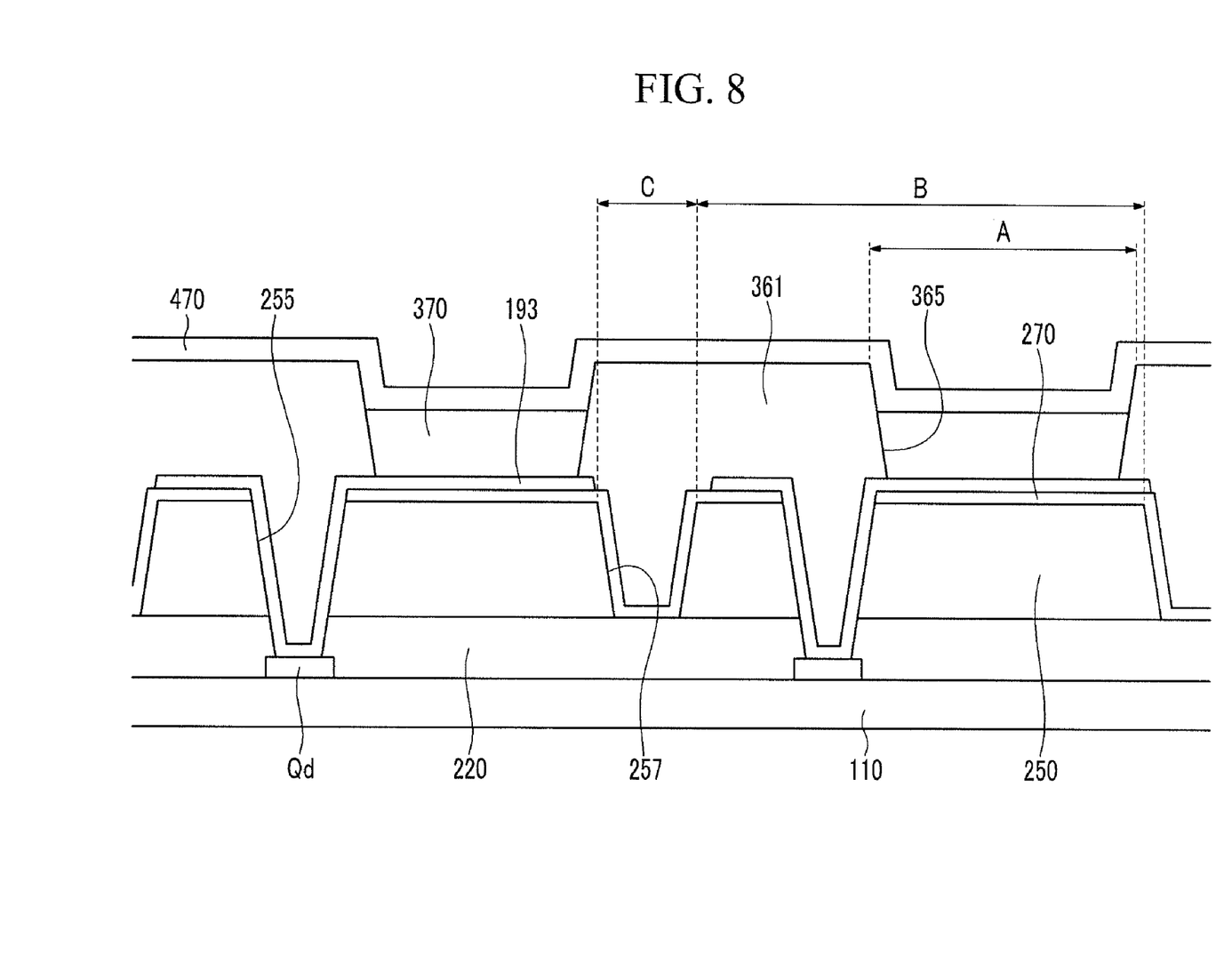
FIG. 8 is a sectional view of an exemplary organic light emitting display according to an exemplary embodiment of the present invention; and, FIGS. 9 to 14 illustrate a method of manufacturing an organic light emitting display according to an exemplary embodiment of the present invention.

FIG. 8 is a sectional view of an exemplary organic light emitting display according to another exemplary embodiment of the present invention. This embodiment is substantially identical to the embodiment illustrated in FIG. 3 except for the blocking layer 270. A duplicate explanation will be skipped.

The blocking layer 270 is formed along the side and the bottom surfaces of the trench 257 and between the organic layer 250 and the pixel electrode 193. The blocking layer 270 can prevent impurities or moisture from penetrating into the light emitting member 370, and include, for example, inorganic material such as silicon nitride.

The pixel electrode 193 is formed in the side and the bottom of the contact hole 255 where the blocking layer 270 is not formed. The pixel electrode 193 can include, for example, a transparent conductor or a reflective metal to block impurities or moisture.

As a result, the organic layer 250 is covered by the blocking layer 250 and the pixel electrode 193, thereby reducing the amount of impurities or moisture emitted from the organic layer 250 which may penetrate into the organic light emitting member 370.

FIGS. 9 to 14 illustrate a method of manufacturing an organic light emitting display of FIG. 8 according to an exemplary embodiment of the present invention.

Figure 9:
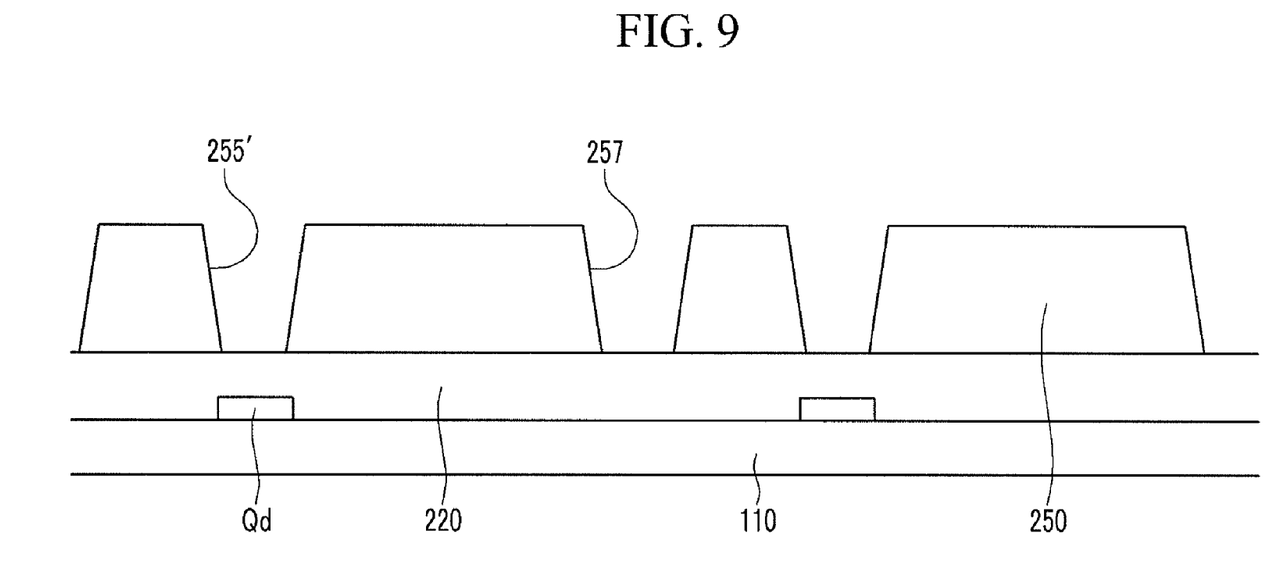

Referring to FIG. 9, a plurality of driving transistors Qd, a thin film structure 220 and an organic layer 250 are formed on an insulating substrate 110. The organic layer 250 is patterned to form holes 255' and trenches 257.

Figure 10:
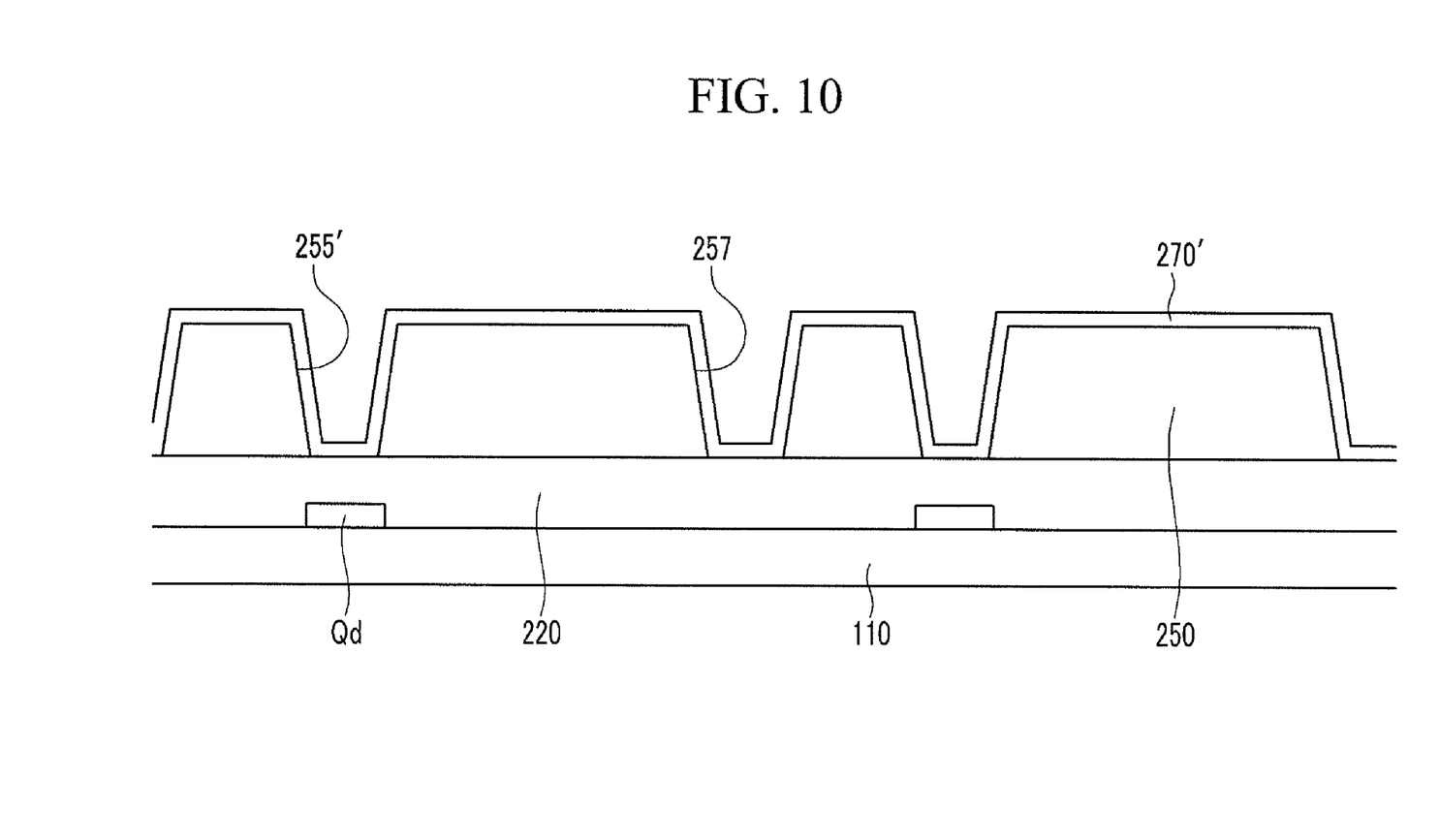

Referring to FIG. 10, a blocking material film 270' including, for example, silicon nitride is formed on the organic layer 250. The blocking material film 270' is formed along the sides and the bottoms of the holes 255' and the trenches 257.

Figure 11:
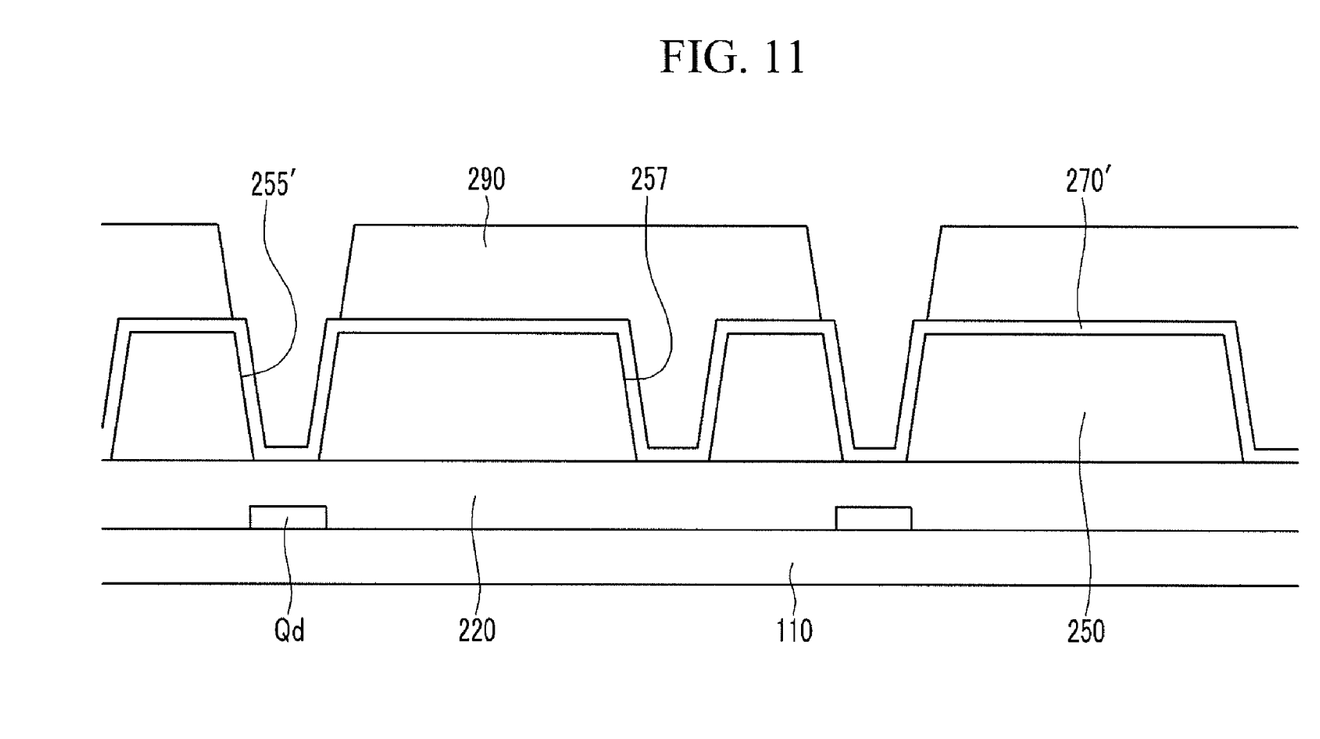

Referring to FIG. 11, a photosensitive layer 290 is formed on the blocking material film 270'. The photosensitive layer 290 is patterned to expose the blocking material film 270' formed along the sides and the bottoms of the holes 255'.

Figure 12:
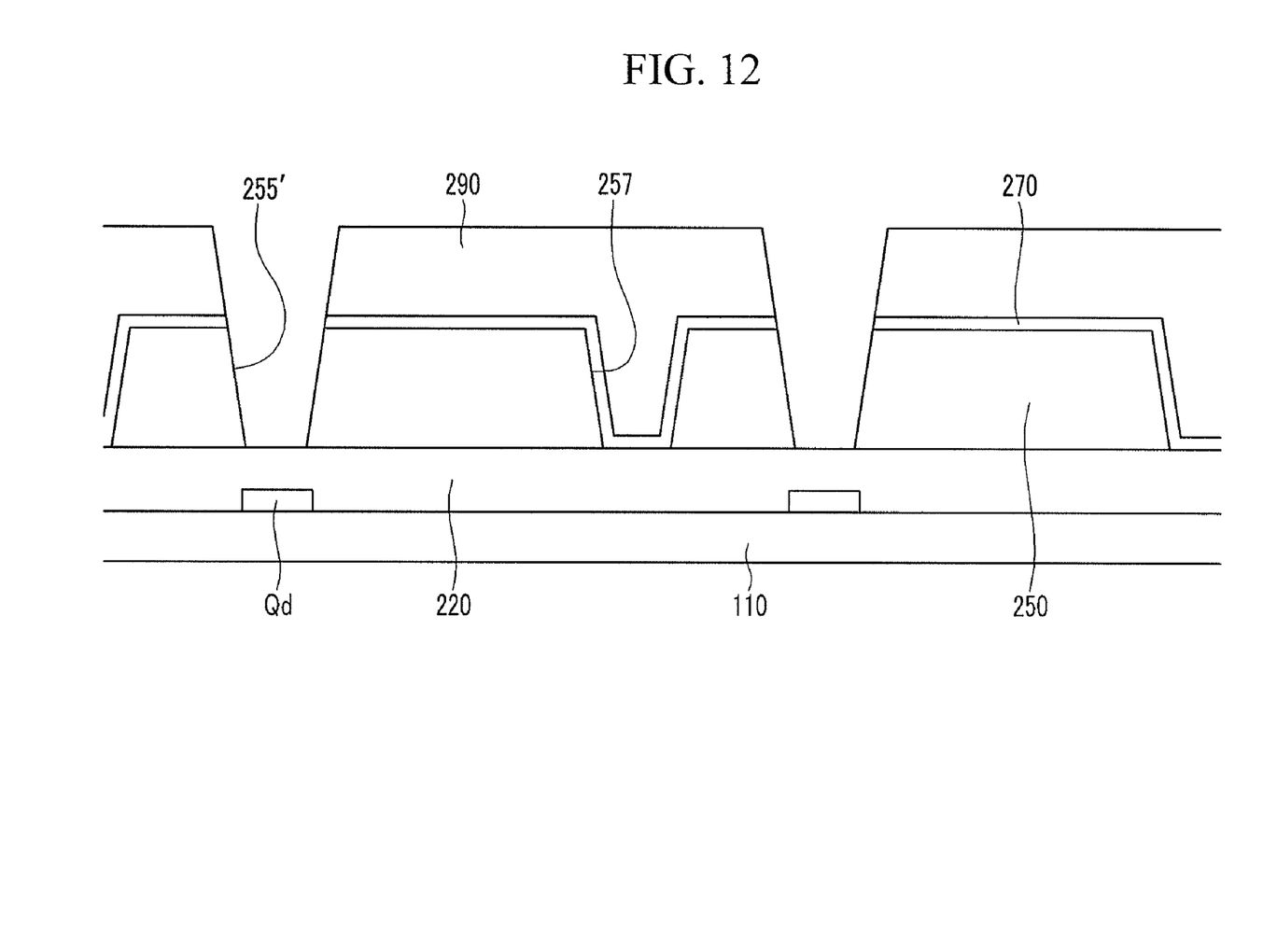

Referring to FIG. 12, the exposed blocking material film 270' is removed to form the blocking layer 270. That is, the blocking material film 270' formed along the sides and the bottoms of the holes 255' is removed to form a blocking layer 270 and to expose a portion of the organic layer 250 and the thin film structure 220.

Figure 13:
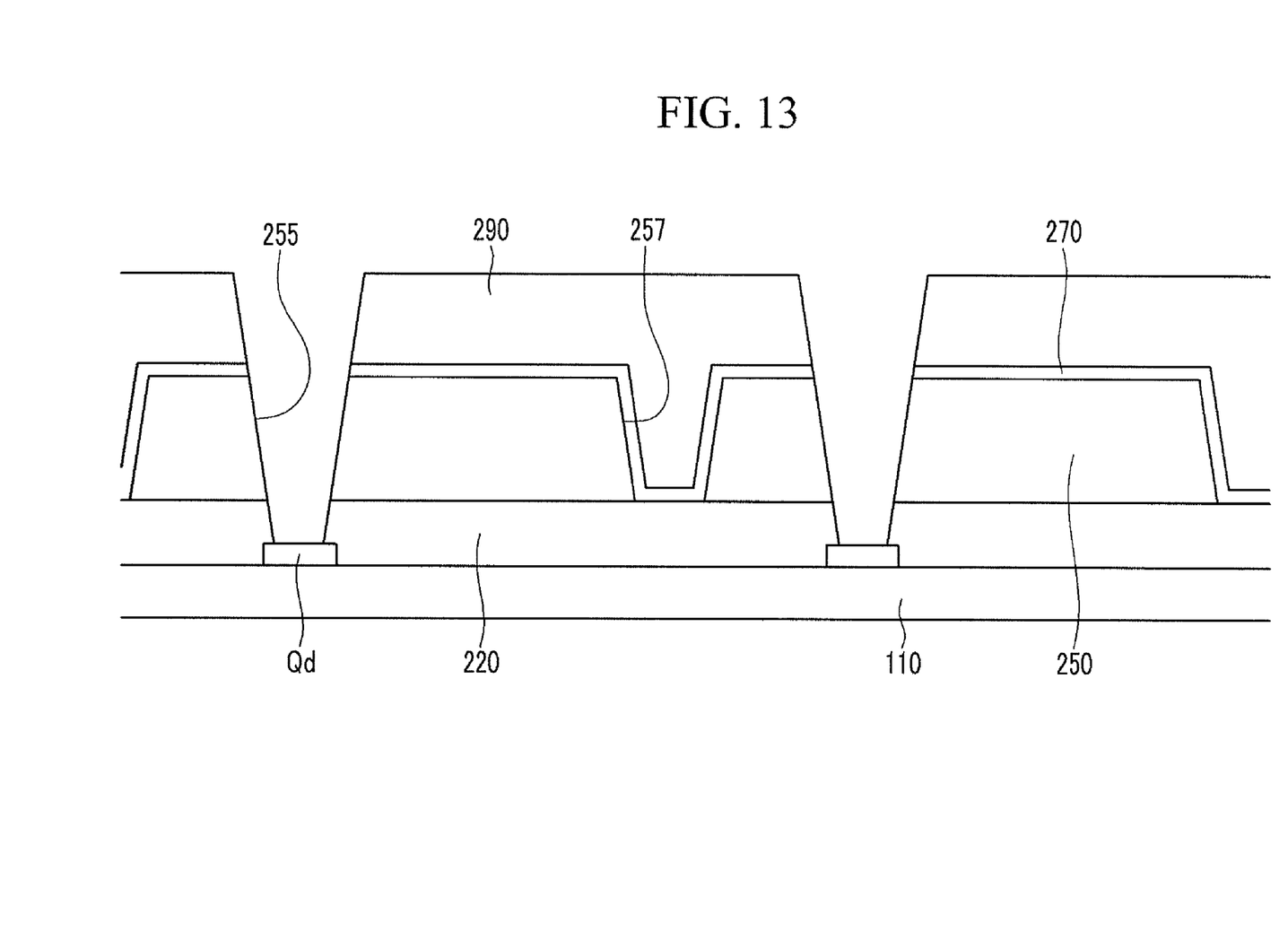

Referring to FIG. 13, the exposed thin film structure 220 through the holes 255' is removed to form contact holes 255 to expose a portion of the driving transistors Qd.

Figure 14:
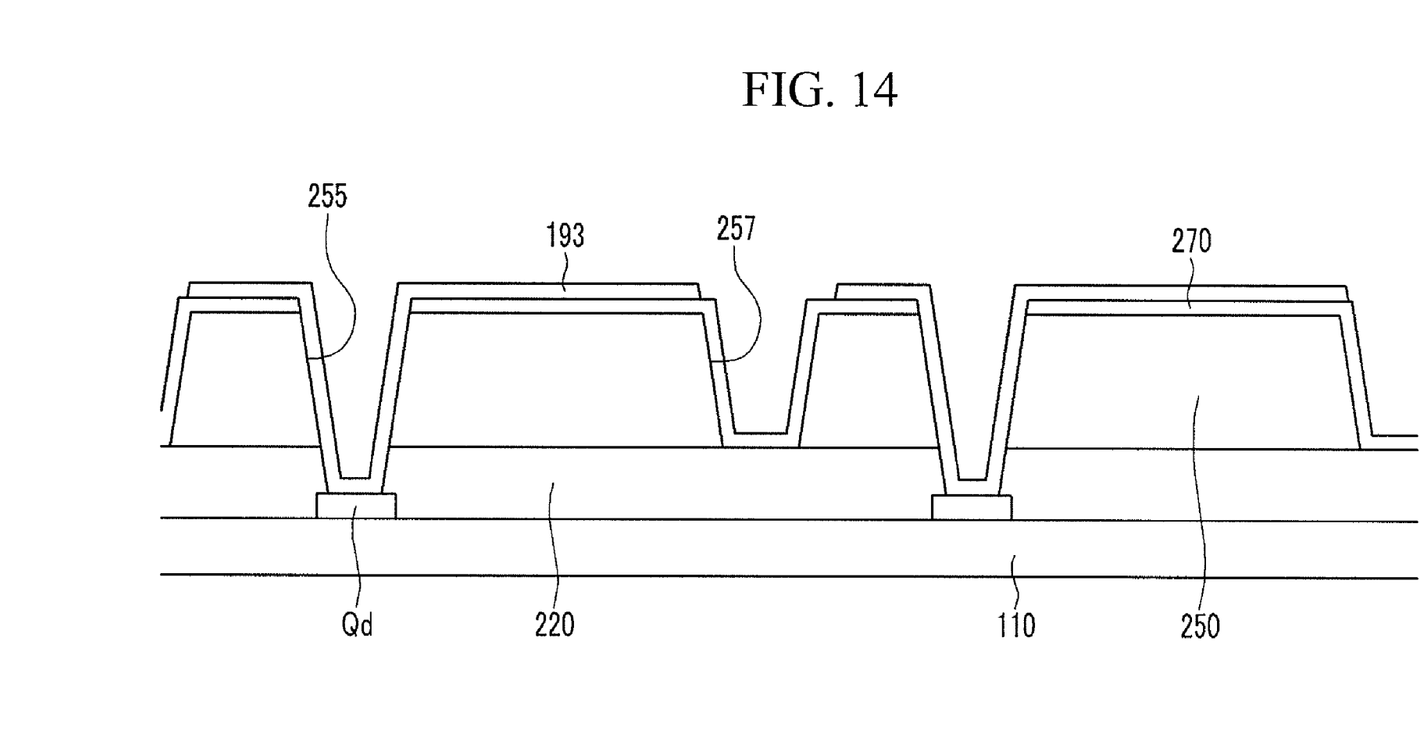

Referring to FIG. 14, the photosensitive layer 290 is removed and a transparent conductive layer including, for example, indium tin oxide or indium zinc oxide is formed on the blocking layer 270 and the contact holes 255. Next, the transparent conductive layer is patterned to form pixel electrodes 193. The pixel electrodes 193 are disposed on a portion of the blocking layer 270 and along the sides and the bottoms of the contact holes 255. The transparent conductive layer on the sides and the bottoms of the trenches 257 is removed to separate the pixel electrode 193 from the adjacent pixel electrodes 193 and to expose the blocking layer 270.

Referring to FIG. 8, a photosensitive organic layer is formed and patterned to form a partition wall 361 including a plurality of openings 365. An organic light emitting member 370 is formed on the pixel electrode to expose through the opening 365. A common electrode 470 is formed on the organic light emitting member 370.

As described above, exemplary embodiments of the present invention provide an organic light emitting display that can reduce emission area shrinkage. Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:
1. An organic light emitting display comprising:
    an insulating substrate having a first area, a second area, and a third area;
    an organic layer located in the second area;
    a pixel electrode located on the organic layer in the first area and the second area;
    a partition wall comprising an opening exposing a portion of the pixel electrode;
    an organic light emitting member located in the opening; and,
    a common electrode located on the organic light emitting member, wherein the opening is disposed in the first area, and wherein the third area comprises a trench separating the second area from an adjacent second area.

2. The organic light emitting display of claim 1, wherein the trench is formed by removing a portion of the organic layer.

3. The organic light emitting display of claim 2, wherein a portion of the pixel electrode is located along an upper side of the trench.

4. The organic light emitting display of claim 3, wherein the trench is filled with the partition wall.

5. The organic light emitting display of claim 4, wherein the partition wall comprises polyimide.

6. The organic light emitting display of claim 2, further comprising a thin film structure comprising a transistor located between the insulating substrate and the organic layer.

7. The organic light emitting display of claim 6, further comprising a contact hole exposing a portion of the transistor, wherein the pixel electrode is located along a side and a bottom of the contact hole.

8. The organic light emitting display of claim 7, wherein the contact hole is disposed in the second area.

9. The organic light emitting display of claim 2, further comprising a blocking layer located on the organic layer and along a side and a bottom of the trench.

10. The organic light emitting display of claim 9, wherein the blocking layer comprises silicon nitride.

11. The organic light emitting display of claim 1, wherein the first area is disposed in the second area.

12. The organic light emitting display of claim 11, wherein the third area surrounds the second area.

13. An organic light emitting display comprising:
a transistor located on an insulating substrate;
an organic layer located on the transistor;
a trench located in the organic layer;
a contact hole exposing a portion of the transistor;
a pixel electrode electrically connected to the transistor through the contact hole;
a partition wall located on the pixel electrode and comprising an opening;
an organic light emitting member located on the pixel electrode; and
a common electrode located on the organic light emitting member.

14. The organic light emitting display of claim 13, wherein the trench exposes a portion of the insulating substrate.

15. The organic light emitting display of claim 14, wherein the pixel electrode covers a portion of an upper side of the trench.

16. The organic light emitting display of claim 15, wherein the partition wall is located inside the trench.

17. The organic light emitting display of claim 13, further comprising a blocking layer located between the pixel electrode and the organic layer and along a side and a bottom of the trench.

18. The organic light emitting display of claim 17, wherein the partition wall is located on the blocking layer in the trench.

19. The organic light emitting display of claim 17, wherein the blocking layer includes silicon nitride.

20. A method of manufacturing an organic light emitting display comprising:
forming a transistor on an insulating substrate;
forming an organic layer on the transistor;
removing a portion of the organic layer to form a contact hole and a trench;
removing impurities or moisture in the organic layer;
forming a pixel electrode on the contact hole and the trench;
forming an insulating layer on the pixel electrode and in the trench;
patterning the insulating layer to form an opening exposing a portion of the pixel electrode;
forming an organic light emitting member in the opening; and
forming a common electrode on the organic light emitting member.

* * * * *